(12) United States Patent
Wright

(10) Patent No.: US 6,515,225 B1
(45) Date of Patent: Feb. 4, 2003

(54) ENCLOSURES

(75) Inventor: Colin Morgan Wright, Burnham on Sea (GB)

(73) Assignee: Cooper B-Line Limited, Highbridge (GB)

( * ) Notice: Subject to any disclaimer, the term of this patent is extended or adjusted under 35 U.S.C. 154(b) by 0 days.

(21) Appl. No.: 09/623,306

(22) PCT Filed: Mar. 16, 1999

(86) PCT No.: PCT/GB99/00780

§ 371 (c)(1),
(2), (4) Date: Oct. 6, 2000

(87) PCT Pub. No.: WO99/48305

PCT Pub. Date: Sep. 23, 1999

(30) Foreign Application Priority Data

Mar. 16, 1998 (GB) ............................................ 9805585

(51) Int. Cl.⁷ ............................. H02G 3/08; H05K 7/18
(52) U.S. Cl. ........................ 174/50; 174/58; 312/265.1; 220/402
(58) Field of Search ................................ 174/50, 17 R, 174/48, 49, 52.4, 63, 58; 220/3.2, 3.3, 4.02; 439/61, 77, 67; 312/265.1, 265.3, 265.5, 265.6, 265.2, 265.4, 128

(56) References Cited

U.S. PATENT DOCUMENTS

| | | | | |
|---|---|---|---|---|
| 3,563,627 | A | * 2/1971 | Whipps | 312/265.2 |
| 5,380,083 | A | * 1/1995 | Jones et al. | 312/265.3 |
| 5,388,903 | A | * 2/1995 | Jones et al. | 312/265.3 |
| 5,488,543 | A | * 1/1996 | Mazura et al. | 361/829 |
| 5,574,251 | A | * 11/1996 | Sevier | 174/50 |

(List continued on next page.)

FOREIGN PATENT DOCUMENTS

| | | |
|---|---|---|
| CH | 613 827 | 10/1979 |
| EP | 0 101 885 | 7/1983 |
| EP | 0 143 718 | 12/1983 |

(List continued on next page.)

OTHER PUBLICATIONS

Extract from Catalog for Electronics Enclosures 96/97 Schroff GmbH (marked "A").
Extract from the 1994 catalogue of BICC VERO Electronics Limited (marked "B").
Leaflet for the IMRAK 700 of VERO Electronics Limited (marked "C").
Leaflet for the ETRAK of Vero Electronics.
Schroff Comrack brochure A Revolutionary New Cabinet Concept.
International Search Report PCT/GB 99/00780.

*Primary Examiner*—Chau N. Nguyen
*Assistant Examiner*—Angel R. Estrada
(74) *Attorney, Agent, or Firm*—Pitney, Hardin, Kipp & Szuch LLP

(57) ABSTRACT

An enclosure suitable for use in a telecommunications or data communications network includes a frame and a plurality of panels. The frame includes first and second upright frame members, an upper forward cantilevered frame portion including elongate side frame portions extending from the upright frame members substantially horizontally forwardly along opposite sides of the enclosure and an elongate transverse portion at the front, and an upper rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members. Similar lower forward and rearward cantilevered frame portions are also provided.

22 Claims, 9 Drawing Sheets

U.S. PATENT DOCUMENTS

| | | | | |
|---|---|---|---|---|
| 5,889,648 A | * | 3/1999 | Heavirland et al. | 174/50 |
| 5,894,106 A | * | 4/1999 | Schwenk et al. | 174/50 |
| 5,901,033 A | * | 5/1999 | Crawford et al. | 174/51 |
| 5,975,315 A | * | 11/1999 | Jordan | 312/265.4 |
| 5,997,117 A | * | 12/1999 | Krietzman | 312/265.4 |
| 6,006,925 A | * | 12/1999 | Sevier | 211/189 |
| 6,081,968 A | * | 7/2000 | Walker et al. | 16/252 |
| 6,169,249 B1 | * | 1/2001 | Teachout et al. | 174/52.1 |
| 6,238,027 B1 | * | 5/2001 | Kohler et al. | 312/265.1 |

FOREIGN PATENT DOCUMENTS

| | | |
|---|---|---|
| EP | 0 577 433 | 1/1994 |
| EP | 0 762 586 | 8/1996 |
| FR | 2 452 230 | 10/1980 |
| FR | 2 661 307 | 4/1990 |
| GB | 0 527 880 | 10/1940 |
| GB | 0 604 344 | 7/1948 |
| GB | 0 737 221 | 9/1955 |
| GB | 0 947 445 | 1/1964 |
| GB | 1 101 356 | 1/1968 |
| GB | 1 141 431 | 1/1969 |
| GB | 1 228 231 | 4/1971 |
| GB | 1 267 705 | 3/1972 |
| GB | 1 512 899 | 6/1978 |
| GB | 1 602 191 | 11/1981 |
| GB | 2 259 641 | 3/1993 |
| GB | 2 268 629 | 1/1994 |
| GB | 2 282 527 | 4/1995 |
| GB | 2 282 706 | 4/1995 |
| GB | 2 294 194 | 4/1996 |
| GB | 2 321 004 | 7/1998 |
| WO | 98/03048 | 1/1998 |
| WO | 98/39954 | 9/1998 |

* cited by examiner

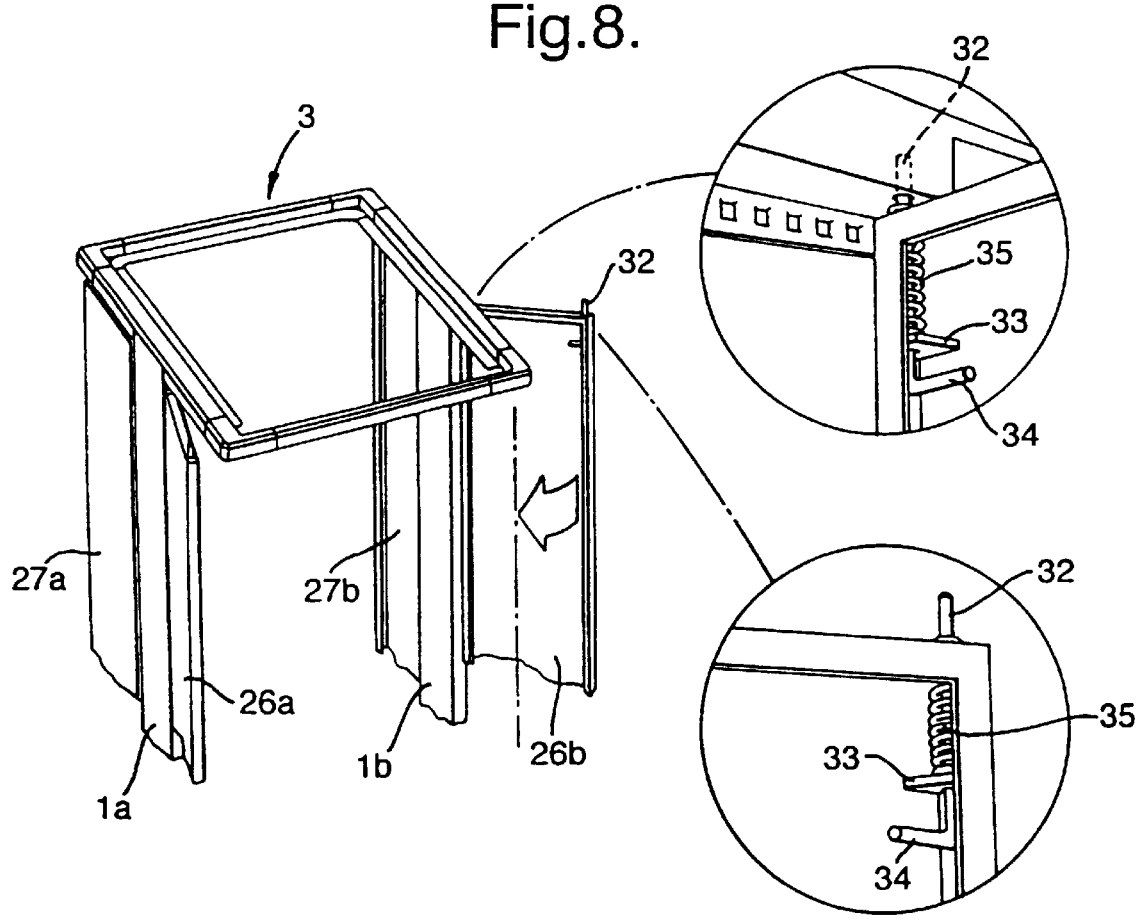

ENCLOSURES

BACKGROUND OF THE INVENTION

The invention relates to enclosures and, in particular, to enclosures suitable for use in a telecommunications network or a data communications network such as a computer network. Such an enclosure is commonly used to house cable connecting equipment but other network equipment, for example servers or modems, may be mounted in the enclosure, according to the requirements of a user.

DESCRIPTION OF THE PRIOR ART

An enclosure is commonly provided in a communications network to house a multiplicity of cable connections. In order to protect the connections and also to protect persons from connections, the connections are surrounded by an enclosure. It is important that the enclosure is substantially closed on all sides in order to provide the desired degree of protection. On the other hand, the cables have to be connected in the enclosure and, in order to make efficient use of space, a high density of connections is desirable; consequently it is desirable for the enclosure to provide as little obstruction as possible to access for the purpose of making the connections initially or to access subsequently to alter connections or for servicing, repair or replacement of equipment. Those two requirements have proved difficult to reconcile.

In the case of a free-standing enclosure it will often be necessary for the enclosure to have panels at both the front and rear and on both sides in order to provide the desired protecting function. It is, however, also possible that, for example, the free-standing enclosure will be placed with its back against a wall so that a back panel is no longer needed and it is also possible that two similar enclosures will be placed immediately adjacent to one another, in which case the adjacent side panels of the two enclosures are no longer needed and indeed may be undesirable if they obstruct the passage of cables from one enclosure to another.

It is an object of the invention to provide an enclosure which is able to provide adequate protection but is also able to provide little obstruction to access to any part of the interior of the enclosure.

SUMMARY OF THE INVENTION

According to the invention there is provided an enclosure suitable for use in a telecommunications or data communications network, the enclosure including a frame and a plurality of panels, the frame including first and second upright frame members, an upper forward cantilevered frame portion including elongate side frame portions extending from the upright frame members substantially horizontally forwardly along opposite sides of the enclosure and an elongate transverse portion at the front, and an upper rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members.

By providing upright frame members from which upper cantilevered frame portions project both forwardly and rearwardly it is possible to provide an enclosure with a frame that causes very little obstruction to access to any part of the interior of the enclosure and yet is able to provide the desired degree of protection when panels are fitted to the frame.

The frame preferably includes upper and lower forward and rearward cantilevered frame portions. Providing lower cantilevered frame portions as well as upper ones further facilitates the provision of a frame that causes very little obstruction to access to any part of the interior of the enclosure.

The side frame portions and transverse frame portion of each cantilevered frame portion are preferably integral with one another. Furthermore the side frame portions of a forwardly projecting cantilevered frame portion may be integral with the side frame portions of a corresponding rearwardly projecting cantilevered frame portion. Thus the upper forwardly and rearwardly projecting cantilevered frame portions may be integral with one another and, similarly, the lower forwardly and rearwardly projecting cantilevered frame portions may be integral with one another.

One or more of the panels are preferably at least partly detachable. As will be described further below, the arrangement of panels and their detachability can be arranged to provide especially advantageous enclosures according to the invention.

Preferably, at least a major part of a first side of the enclosure is defined by a front side panel extending forwardly from the first upright frame member and a rear side panel extending rearwardly from the first upright frame member, one of the side panels being at least partly detachable. By providing at least partly detachable front and rear side panels extending in opposite directions from the first upright frame member, which is therefore intermediate the front and back of the enclosure, an enclosure can be realised, which can readily be fully closed, but in which when, say, the front side panel, is partly or fully detached, is very accessible from the front or the first side to the front of the first upright member. Similarly, when the rear side panel is partly or fully detached, the enclosure can become very accessible from the rear or from the first side to the rear of the first upright member.

The frame can be used to provide the structural S strength of the enclosure, the panels being supported by the frame.

Preferably the front side panel is at least partly detachable. Preferably the front side panel is pivotable about a substantially vertical axis at a front and/or rear end of the panel; such partial detachment of the side panel enables good access to be obtained to the side of the enclosure at the front when the side panel is pivoted into an open position. The partial detachment may be achieved by releasing a latching device, such as a sliding pin or a lock, at the end of the front side panel opposite the end at which the pivot axis is disposed. As indicated above, the front side panel may be pivotable about a substantially vertical axis at its rear end and/or at its front end. In a case where pivotability is provided at both ends the pivots may be selectively disengageable so as to release one end of the side panel and allow pivoting about an axis at the other end. Preferably the front side panel is fully detachable; when the front side panel is fully detached even greater access is provided to the side of the enclosure at the front.

Similarly, the rear side panel is also preferably at least partly detachable and, more preferably, fully detachable and is preferable pivotable about a substantially vertical axis at a front and/or rear end of the panel. As described above for the front side panel, a latching device, such as a sliding pin or a lock, may be provided at the end of the panel opposite the end at which the pivot axis is disposed and the panel may be pivotable at either or both ends. The rear side panel is also preferably fully detachable. Thus good access can be provided to the side of the enclosure at the rear.

Especially if two enclosures are to be placed side-by-side it may be desirable for only one side of each enclosure to be as defined above and side panels may be omitted from the adjacent sides of the enclosures, but in a more usual case it is preferable for both sides of the enclosure to be of similar form. Thus, preferably at least a major part of the first side of the enclosure is defined by a first front side panel extending forwardly from the first upright frame member and a first rear side panel extending rearwardly from the first upright frame member and at least a major part of a second opposite side of the enclosure is defined by a second front side panel extending forwardly from the second upright frame member and a second rear side panel extending rearwardly from the second upright frame member.

Preferably each of the front side panels and the rear side panels is partly or fully detachable and preferably also pivotable, preferably about a substantially vertical axis at a respective corner of the enclosure and/or about a substantially vertical axis adjacent to an upright frame member.

Whilst it may sometimes be preferable not to have a front door panel or even to have a permanently fixed front panel, the enclosure preferably further includes a front door panel defining the front of the enclosure, the front door panel being at least partly detachable.

As with the side panels described earlier, the front door panel is preferably pivotable about a substantially vertical axis at one side and at the front of the enclosure. The front door panel can be secured by a latching device, such as a sliding pin or a lock, at the other side. Also a releasable pivot mounting may be provided at both sides of the front door panel; the front door panel can be fully detachable. In an enclosure incorporating the preferred features referred to above, with the front door panel and both the front side panels fully detached the whole of the front of the enclosure is freely accessible as are the sides to the front of the upright frame members.

A rear door panel may also be provided and, if so, it is preferably of similar construction to the front door panel. For example, the rear door panel preferably defines the back of the enclosure, the rear door panel being at least partly detachable; the rear door panel is preferably pivotable about a substantially vertical axis at one side and at the rear of the enclosure; the rear door panel is preferably fully detachable.

Preferably, substantially all of the first side of the enclosure is defined by the first upright frame member, the front side panel extending forwardly from the first upright frame member and the rear side panel extending rearwardly from the first upright frame member. Preferably, the second side of the enclosure is substantially the same. Such features can result in an arrangement where, with the side panels pivoted open or detached, the side of the enclosure is fully accessible except where the first upright frame member is present.

Preferably the front of the enclosure at the first side of the enclosure is free of any frame members of substantially vertical extent compared with the height of the enclosure. In such an arrangement, with the front panel removed or opened, access to the whole of the front of the enclosure is unimpeded by any frame members.

In certain circumstances it may be convenient to provide the upright frame members at a position offset from a midway point between the front and rear of the enclosure. Usually, however, it is preferable for the upright frame members each to be substantially equispaced from the front and rear extremities of the enclosure.

In an illustrated embodiment of the invention to be described each of the upper and lower frame portions is formed exclusively from members disposed exclusively around the sides of the frame; transverse bracing of the frame is obtained from the front and rear transverse portions of the upper and lower frame portions. Such an arrangement is advantageous in that, when viewed in plan, the whole of the middle of the enclosure is free of any frame members. Nonetheless it is within the scope of the invention for one or more transverse members to be provided elsewhere; the transverse members may for example extend between the upright frame members at the top and bottom of the frame.

Preferably, the frame is a skeleton frame. Such an arrangement both reduces the weight of the frame and causes minimal obstruction to access. The frame portion preferably comprises one or more tubular members or roll form section members.

Where reference is made in this specification to a "member", it should be understood that the member does not necessarily consist of a single component. It may for example comprise two components fixed together and, once so fixed, behaving essentially as a single component. Also, it may comprise a load-bearing member to which one or more trim elements are fixed. Indeed, preferably one or more of the frame members making up the frame include elongate load bearing members to which trim elements are fixed. The trim elements may include one or more elements that incorporate mounting means for mounting one or more side panels.

The enclosure preferably further includes upright mounting angles suitable for mounting equipment for use in a telecommunications or data communications network. In an enclosure for use in a telecommunications or data communications network it is conventional to provide vertically extending mounting angles for mounting electrical equipment such as cable connecting equipment and/or computer equipment such as modems and servers. The mounting angles may be arranged according to any required standard; for example they may be IEC 297-1 mounting angles or ETSI 300-119 Part 3 mounting angles or mounting angles according to any other telecommunications standard. Upright mounting angles may be provided in a front region and/or in a rear region of the enclosure. The mounting angles are preferably supported at least partly by the upper forward and/or rearward cantilevered frame portions. Upright mounting angles may also be fixed to the upright frame members and extend along at least parts of the lengths of the upright frame members. A plurality of pairs of upright mounting angles may be provided, one pair being spaced further apart from one another than another pair. Two pairs of upright mounting angles may be positioned one above the other with one pair being spaced further apart from one another than the other pair.

Especially in a case where a pair of mounting angles do not extend over the whole height of the enclosure it may be desirable to provide one or more supports cantilevered from the upright frame members and extending forwardly or rearwardly therefrom and providing at their distal ends support for ends of respective mounting angles.

According to a second aspect of the invention, there is provided an enclosure suitable for use in a telecommunications or data communications network, the enclosure including a frame and a plurality of panels defining the exterior shape of the enclosure, wherein the frame includes first and second upright frame members provided at opposite sides of the enclosure, and wherein at least a major part of a first side of the enclosure is defined by a front side panel extending forwardly from the first upright frame member and a rear side panel extending rearwardly from the first upright frame member, one of the side panels being at least partly detachable.

The frame preferably further includes an upper forward frame portion extending forwardly from the upright frame members at the top of the enclosure and fixed directly or indirectly to the upright frame members. The frame preferably further includes an upper rearward frame portion extending rearwardly from the upright frame members at the top of the enclosure and fixed directly or indirectly to the upright frame members. The frame preferably further includes a lower forward frame portion extending forwardly from the upright frame members at the bottom of the enclosure and fixed directly or indirectly to the upright frame members. The frame preferably further includes a lower rearward frame portion extending rearwardly from the upright frame members at the bottom of the enclosure and fixed directly or indirectly to the upright frame members.

Preferably the frame portions rely predominantly upon their direct or indirect fixing to the upright frame members for their structural support and in that sense can be described as cantilevered from the upright frame members.

The or each frame portion preferably comprises a pair of substantially horizontal side portions and a substantially horizontal transverse portion at the front or rear of the enclosure, each side portion extending between the region of a respective upright frame member and a respective end of the transverse portion. The respective portions of a frame portion are preferably integral with one another.

An enclosure in accordance with the second aspect of the invention may have any of the features described above in relation to the enclosure of the first aspect of the invention.

According to a third aspect of the invention, there is provided an enclosure suitable for use in a telecommunications or data communications network, the enclosure including a frame, a plurality of panels defining the exterior shape of the enclosure, and mounting angles for mounting electrical equipment forming part of a telecommunications or data communications network, the mounting angles preferably being arranged in accordance with a telecommunications standard for mounting angles, wherein the frame includes first and second upright frame members provided at opposite sides of the enclosure intermediate the front and rear of the enclosure, and the mounting angles are supported by the upright frame members via at least one cantilevered support.

An enclosure according to the third aspect of the invention can be completely free of any uprights or frame members throughout its height either to the front or to the rear of the first and second upright frame members.

An enclosure in accordance with the third aspect of the invention may have any of the features described above in relation to the enclosure of the first aspect of the invention.

An advantageous feature of the enclosure of the present invention is that it can be provided as a kit comprising a plurality of separate components which can be packed essentially flat. Accordingly the invention further provides a flat pack including frame members and panels for assembling on-site into an enclosure as defined above.

The invention further provides an enclosure installation including an enclosure as defined above, electrical equipment housed within the enclosure and cables extending from outside the enclosure into the enclosure and connected to the electrical equipment. The electrical equipment may, for example, comprise cable connection equipment and/or equipment such as computer hardware or modems.

The invention further provides a telecommunications or data communications network including an enclosure installation as defined above.

The invention still further provides a method of connecting cables to electrical equipment in an enclosure, the method including the following steps:

locating a frame structure of the enclosure in its required position, connecting ends of cables to electrical equipment within the enclosure, and securing panels, including side panels, to the frame structure to form an enclosure installation as defined above.

The method may further include the step of assembling the frame structure.

The enclosure may be supplied as a flat pack.

BRIEF DESCRIPTION OF THE DRAWINGS

By way of example, certain embodiments of the invention will now be described with reference to the accompanying drawings, of which FIG. 8 is a perspective view of the top of the enclosure, including two detail views and showing the pivotal connection of the side panels to the frame.

DETAILED DESCRIPTION OF THE DRAWINGS

Figure 1:
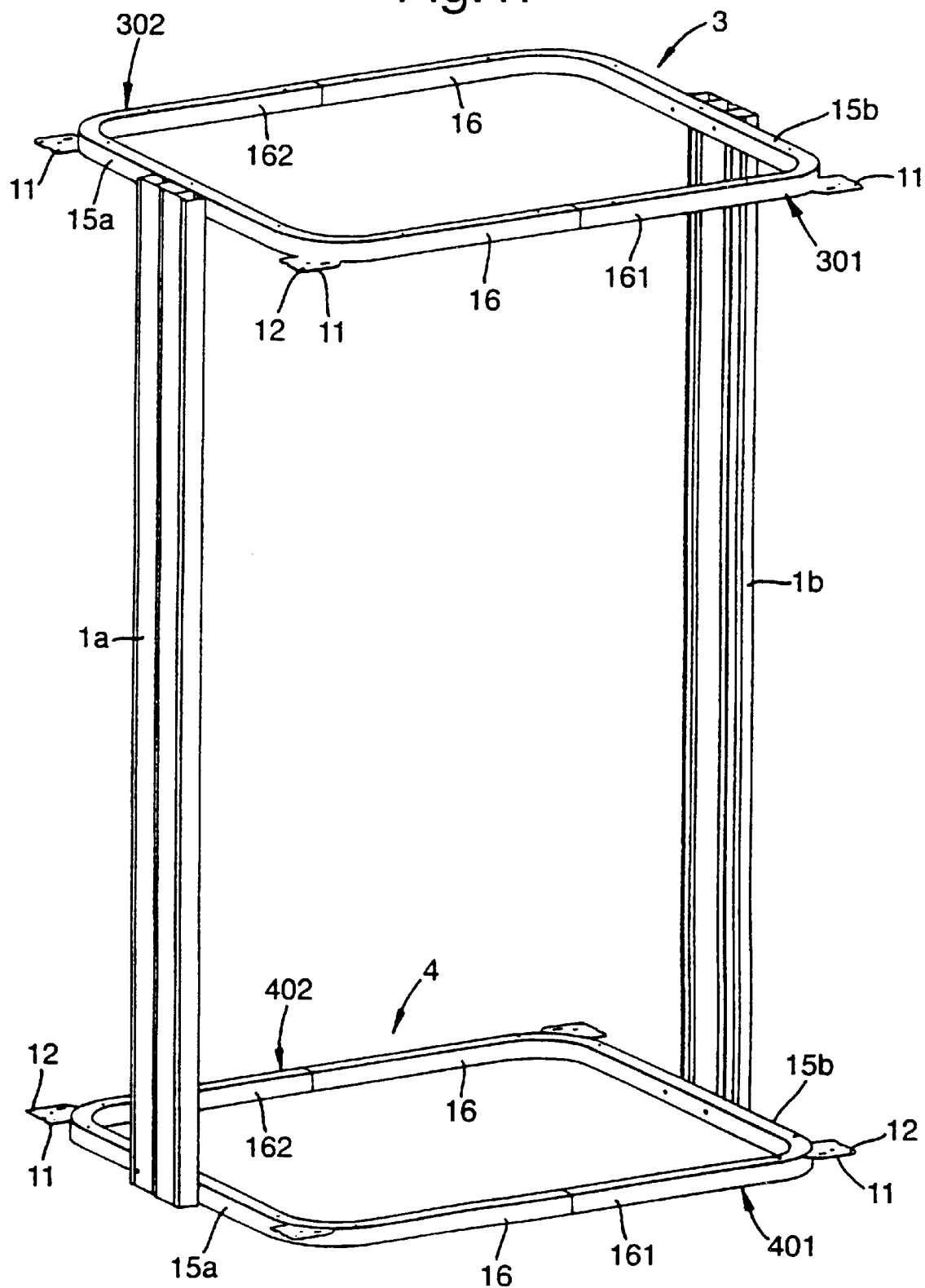
FIG. 1 is a perspective view of a frame part of the enclosure.

It is convenient to describe the enclosure by describing the sequence of steps by which it is assembled. FIG. 1 shows a first stage of assembly in which a pair of upright side frame members 1a, 1b are fixed to a top frame member 3 and a bottom frame member 4. Each frame member 3, 4 is securely fixed, for example by bolts, to the inside faces of the upright members 1a, 1b at their top and bottom ends respectively. The top and bottom frame members are formed in this particular example from tubular members of square cross-section (an alternative would be a roll form section) bent to form a generally rectangular shape with curved corners. The top frame member 3 is located directly above the bottom frame member 4. In that way a rigid rectangular frame comprising top and bottom frame members 3, 4 and upright side frame members 1a, 1b fixed directly thereto is formed. The frame members 1a, 1b may incorporate decorative trim elements fixed to their outer faces.

As may be seen in FIG. 1, each of the top and bottom frame members 3, 4 is, for ease of assembly, made from two parts which join at the front and rear middles of the frames; at least in the completed enclosure the two parts are securely joined together and each behaves as a single frame member; for example, connection members (not shown) may be provided in the tubular members and span the interface of the abutting frame portions. Each of the frame members 3, 4 comprises opposite side portions 15a, 15b and a transverse portion 16. In that way a strong skeleton frame of the symmetrical shape shown in FIG. 1, is produced. The front portions of the frame members 3, 4 are each connected in cantilever fashion to the upright side frame members 1a, 1b and similarly the rear portions of the frame members 3, 4 are each connected in cantilever fashion to the upright side frame members 1a, 1b.

As may be understood with reference to FIG. 1, the top frame member 3 may be regarded as comprising an upper forward cantilevered frame portion 301 consisting essentially of elongate side frame portions (the forward halves of top side portions 15a and 15b) and an elongate top transverse portion 161 at the front, and also an upper rearward cantilevered frame portion 302 consisting essentially of elongate side frame portions (the rearward halves of top side portions 15a and 15b) and an elongate top transverse portion 162 at the rear. Similarly the bottom frame member 4 may be regarded as comprising a lower forward cantilevered frame portion 401 consisting essentially of elongate side frame portions (the forward halves of bottom side portions 15a and 15b) and an elongate bottom transverse portion 161 at the front, and also a lower rearward cantilevered frame portion 402 consisting essentially of elongate side frame portions (the rearward halves of bottom side portions 15a and 15b) and an elongate bottom transverse portion 162 at the rear.

Fixed at each of the eight corners of the skeleton frame are respective mounting plates 11 which project outwardly from the corners and include holes 12 for mounting front and rear door panels as will be described more fully below. The plates 11 may be welded to the frame members 3, 4.

Figure 2:
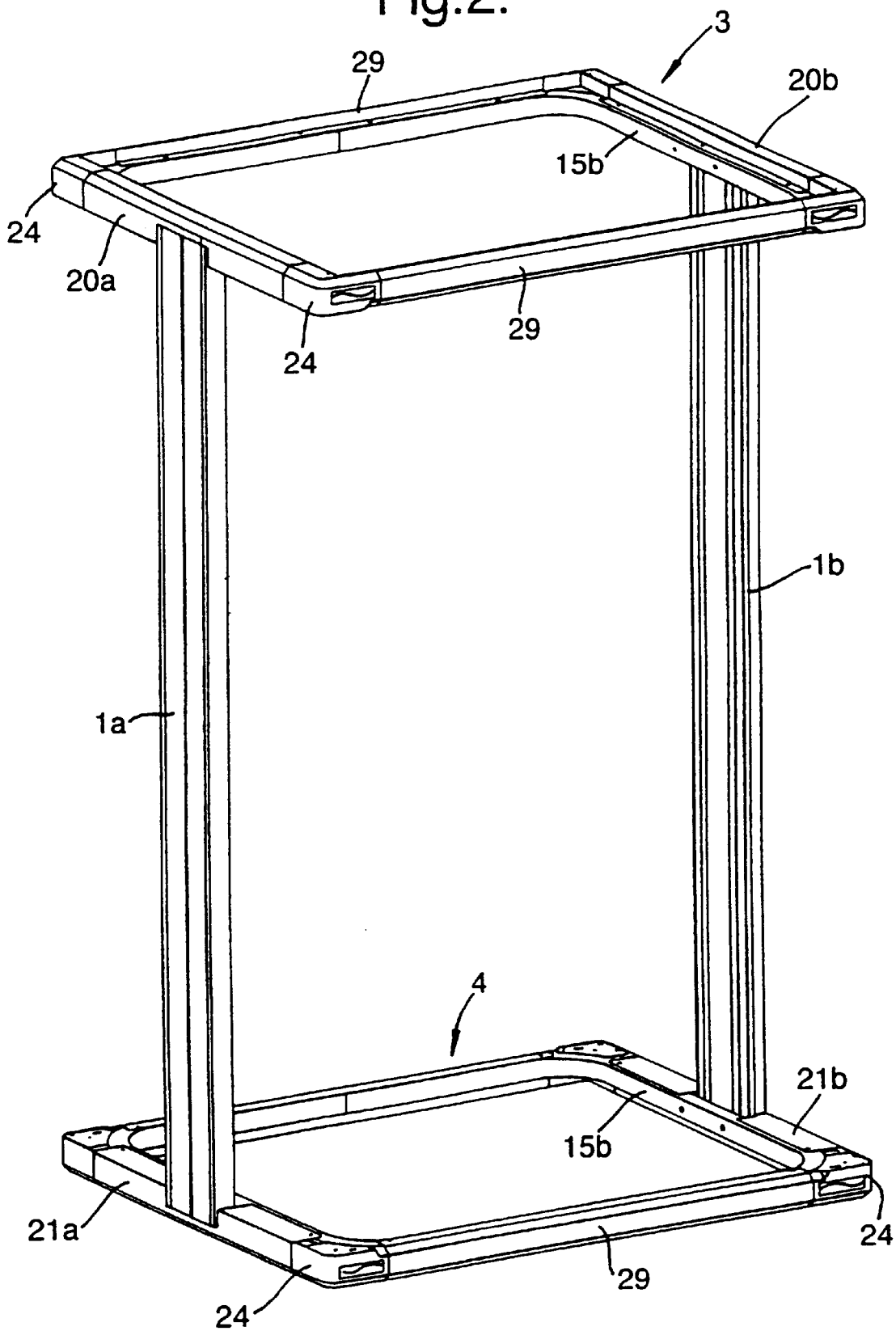
FIG. 2 is a perspective view of the frame of FIG. 1 with some trim elements added.

FIG. 2 shows certain trim elements added to the top and bottom frame members 3 and 4. More specifically an upper trim element 20a is secured over the upper side portion 15a of the frame member 3, an upper trim element 20b is secured over the upper side portion 15b of the frame member 3, a lower trim element 21a is secured on the lower side portion 15a of the frame member 4 and a lower trim element 21b is secured on the lower side portion 15b of the frame member 4. It will be seen that the trim elements are cut-out so as to fit round the upright side frame members 1a, 1b. Further trim elements 29 are fitted around the transverse frame portions 16. The trim elements are in this particular example formed from sheet metal bent into the cross-sectional shape shown in FIG. 2 and are all the same. Alternatively they may be extruded. They are fixed to the other parts of the frame by any suitable means. Corner trim elements 24 are provided at the eight corners of the frame to provide a smooth exterior to the frame. The trim elements 24 are formed of plastics material.

Figure 3:
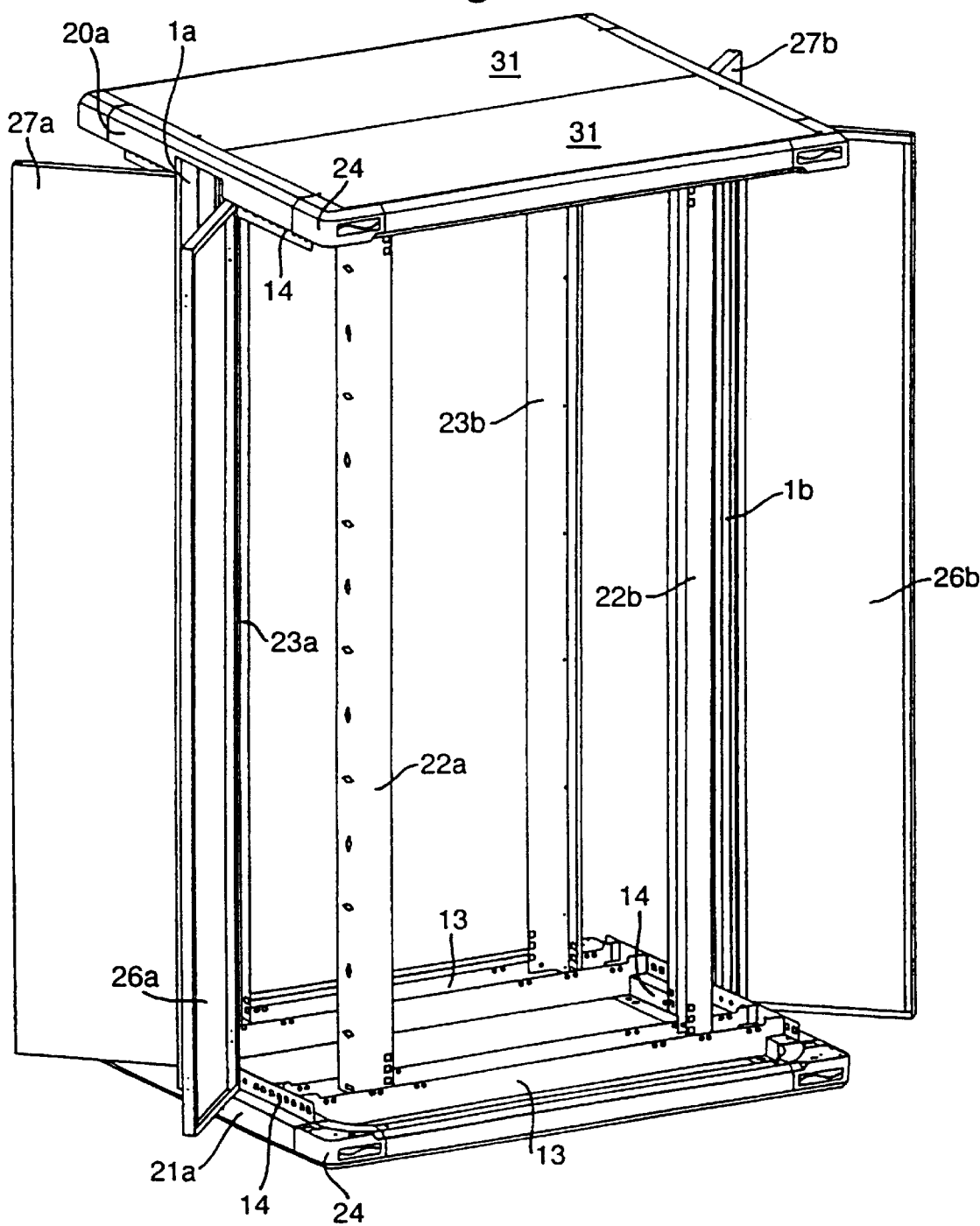
FIG. 3 is a perspective view of the frame of FIG. 2 with two pairs of mounting angles and some side panels added.

Referring now to FIG. 3, a pair of upright mounting angles 22a and 22b are provided towards the front of the enclosure and another pair of mounting angles 23a and 23b are provided towards the rear of the enclosure. If desired a pair of mounting angles can be provided along the inside faces of the upright side frame members 1a and 1b, but such mounting angles are not shown in FIG. 3. The opposite ends of the mounting angles 22a and 22b are fixed to top and bottom front transverse members 13 (only the bottom one of which is visible in FIG. 3) and, similarly, the opposite ends of the mounting angles 23a and 23b are fixed to top and bottom rear transverse members 13 (only the bottom one of which is visible in FIG. 3). The ends of the transverse members 13 are in turn fixed to fixing rails 14 as will be more fully described below. The mounting angles are shaped and apertured according to one of the telecommunications standards so that electrical equipment, which may for example comprise cable blocks for connecting cables to one another and/or modems or servers, can be mounted in the enclosure.

FIG. 3 also shows a pair of partly open, front side panels 26a and 26b and a pair of partly open, rear side panels 27a and 27b. The front side panel 26a extends forwardly from the upright frame member 1a to the front of the enclosure and, similarly, the front side panel 26b extends forwardly from the upright frame member 1b to the front of the enclosure. The rear side panel 27a extends rearwardly from the upright frame member 1a to the rear of the enclosure and, similarly, the rear side panel 27b extends rearwardly from the upright frame member 1b to the rear of the enclosure. Thus, as can be seen in FIG. 3, substantially all of the left hand side of the enclosure is defined by the side panels 26a and 27a and the upright frame member 1a that is interposed between them: other parts of the side are defined by edges of front and rear door panels 25 and 36 and by faces of the trim elements 20a, 21a and 24. The right hand side of the enclosure is of substantially the same construction; thus substantially all of the side is defined by the side panels 26a and 27a and the upright frame member 1a that is interposed between them: other parts of the side are defined by edges of the front and rear door panels 25 and 36, and by faces of the trim elements 20a, 21a and 24.

Each of the side panels 26a, 26b, 27a and 27b is mounted in substantially the same way and the mounting of the front side panel 26b will now be described by way of example with reference to FIG. 8. The panel 26b is pivotably mounted for pivoting about a vertical axis at the right hand side of the enclosure and either adjacent to the frame member 1b or at the extreme front of the enclosure. The pivotal mounting is provided by four pins 32 mounted at the front and rear, top and bottom of the panel 26b and resiliently biased into engagement with holes in the frame members 3, 4 and the trim elements 24.

The side panels are made of sheet metal and have inwardly directed flanges around their periphery. Each pin 32 is slidably mounted by virtue of passing through both a hole in an inwardly directed horizontal flange of the panel and a hole in a lug 33 projecting inwardly from an inwardly directed vertical flange of the panel. Each pin 32 is resiliently biased outwardly by a compression spring 35 compressed between the lug 33 and a flange (not shown) on the pin 32. Finally the inner end of the pin 32 is formed with a crank 34 by which it can readily be gripped by an operator. As will be understood, each pin 32 can be engaged or disengaged from an associated hole in one of the frame members 3, 4 or the trim elements 24, by pulling the crank 34 so as to draw the opposite end of the pin 32 into the side panel against the resilient bias of the spring 35.

In FIG. 8, the side panel 26b is shown pivoting about an axis adjacent to the frame member 1b. It will be understood that this pivoting action is enabled by disengaging the two pins 32 at the extreme front of the enclosure from the frame. Whilst pivoting of that kind is more likely to be preferred, it is also possible for a user instead to disengage the two pins 32 adjacent to the frame member 1b. In that case, the side panel 26b pivots about an axis adjacent to the extreme front of the enclosure. It will also be understood that by releasing all four pins 32, the side panel 26b can be removed completely. It will be understood that the other side panels 27b and 26a and 27a are similarly mounted.

FIG. 3 also shows a pair of top panels 31 filling in the top of the enclosure.

Once the assembly stage of FIG. 3 has been reached and indeed, if desired, before the attachment of the top panels 31 and/or the side panels 26a, 26b, 27a, 27b, it is possible to mount the required electrical equipment on one or both pairs of mounting angles and to connect cables to the equipment as desired, the cables usually entering the enclosure at the rear or from above (although the cables may for example enter from the side, especially in the case where two similar enclosures are fixed side-by-side by fastening together the side frame member 1a of one enclosure with the immediately adjacent side frame member 1b of another enclosure— in this case the side panels of the adjacent sides are conveniently omitted). It will be noted, however, that even with the side panels partly attached, as shown in FIG. 3, they hardly reduce at all access to all parts of the enclosure.

Figure 4:
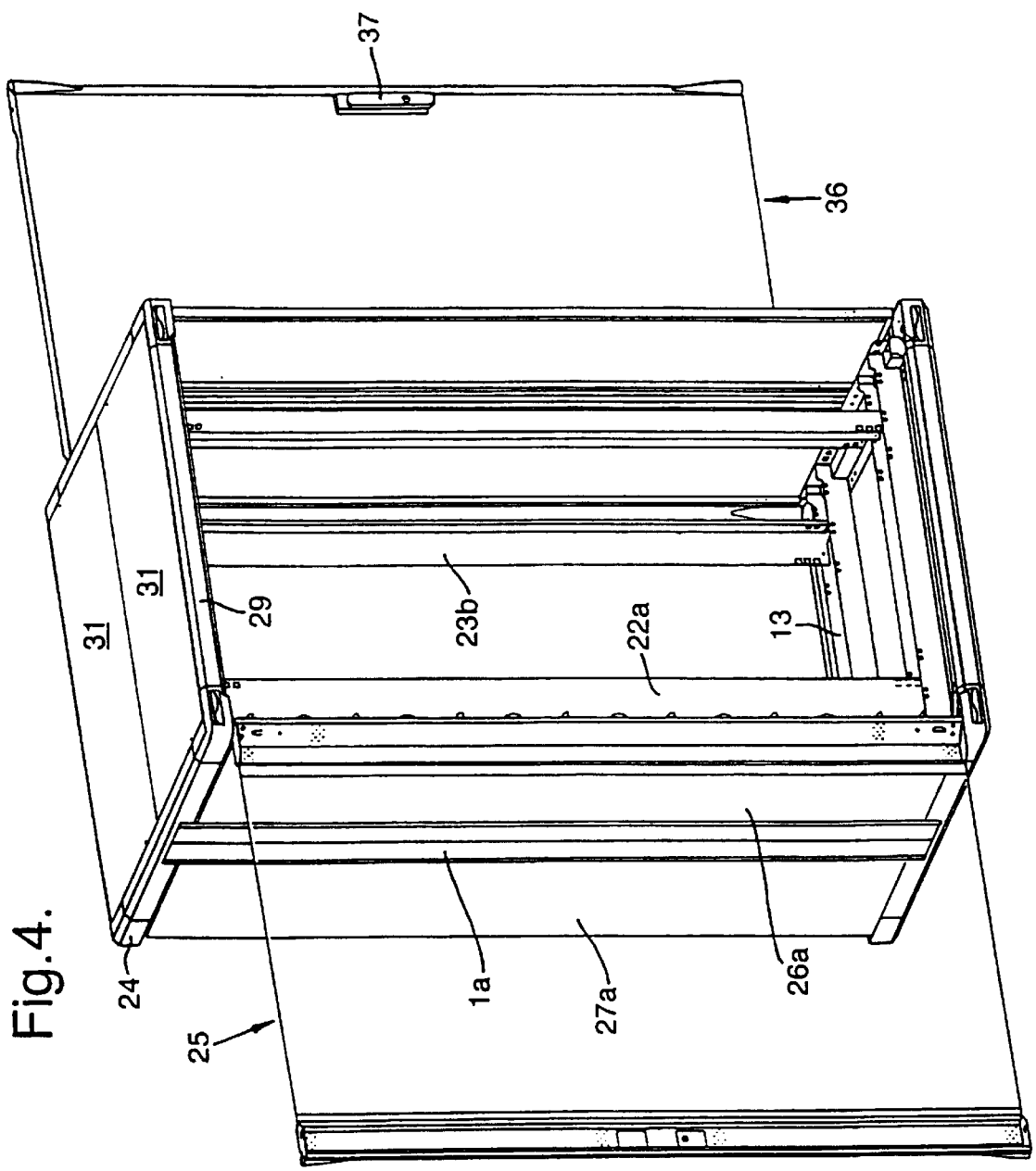
FIG. 4 is a perspective view of the frame of FIG. 3 with front and rear door panels added, the door panels being shown in an open position.
Figure 5:
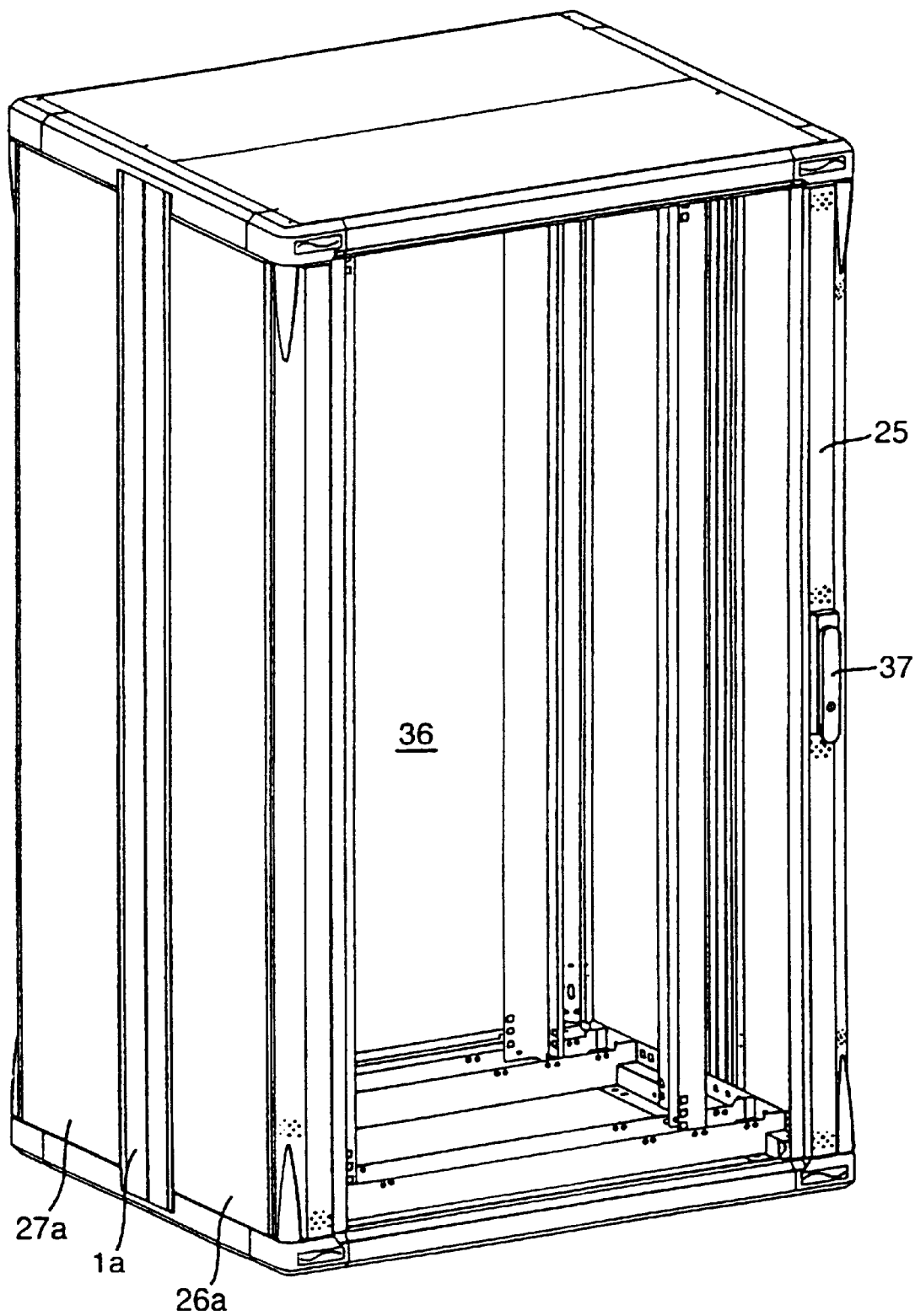
FIG. 5 is a perspective view of the frame of FIG. 4 with the door panels shown in a closed position to provide a completed enclosure.

FIG. 4 shows a complete enclosure including a front door panel 25 and a rear door panel 36. In this particular example the front door panel 25 is partly transparent, but it may be opaque. In FIG. 4 the front and rear door panels 25, 36 are shown in fully open positions. FIG. 5 shows the enclosure with the front and rear door panels 25, 36 fully closed. It will be seen that each door panel can be opened through 180°.

The front door panel 25 is pivotally mounted on the mounting plates 11 that are adjacent to the top and bottom of the front side panel 26a by pin arrangements of the kind shown in FIG. 8, with the pins 32 engaging the holes 12 in the mounting plates 11. On the other side, the door panel is provided with a lockable locking lever 37 which is rotatable to operate a locking mechanism to move pins like pins 32 outwardly and inwardly of the door panel to engage and disengage the pins from the holes 12 in the mounting plates 11 that are adjacent to the top and bottom of the front side panel 26b. It will be understood that the panel can be detached fully from the frame by moving the pins that provide the pivotal mounting inwards against their resilient bias so that they are clear of the mounting plates 11. The rear door panel 36 is similarly mounted, has a similar locking lever 37, and is pivotable about a vertical axis at the rear of the enclosure.

The front door panel 25 has a central transparent part at either side of which metal marginal parts are fixed. In an alternative embodiment, not illustrated, the front door panel 25 is made entirely of sheet metal. The pivot mounting of the front door panel 25 may be the same as for the side panels.

Although not shown in the drawings, it should be understood that, if desired, a bottom panel can be provided.

Figure 6:
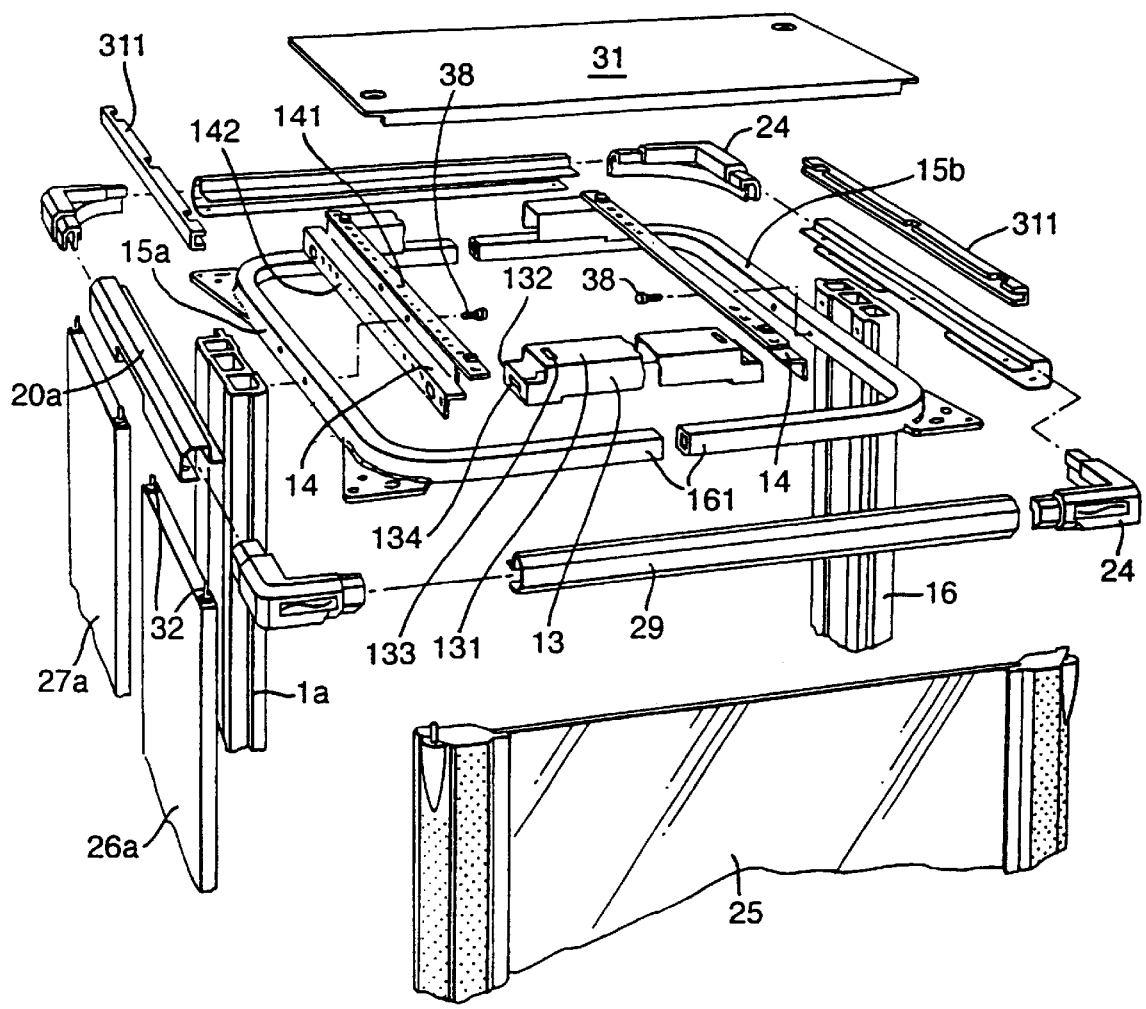
FIG. 6 is an exploded perspective view of the top of the enclosure shown in FIG. 5.

FIG. 6 shows in more detail the construction of the top of the enclosure. The drawing shows a single bolt 38 securing the top frame member 3 to each side frame member 1a, 1b, but it will be understood that a second bolt is also provided on each side engaging in the other hole shown in each of the side frame members 1a, 1b. Also in FIG. 6, only one of the top panels 31 is shown; it is shown having trim members 311 fitting over its sides.

FIG. 6 also shows how the transverse members 13 are fitted to the fixing rails 14 and how the fixing rails 14 are fitted to the frame members 3 and 4. The fixing rails 14 are permanently fixed along the side portions 15a, 15b of the frame member 3 by the bolts 38. The transverse members 13 are adapted to be securable to the fixing rails 14 in a wide range of positions. It will be seen that each rail 14 is provided with a horizontal, perforated, fixing surface 141 and a vertical, perforated, fixing surface 142; the end of each member 13 has a corresponding horizontal surface 131 with an elongate hole 133 and a corresponding vertical surface 132 with an elongate hole 134. The perforations in the rail 14 are square enabling nuts to be non-rotatably held therein and the members 13 are fixed to the rails 14 by bolts which pass through the elongate holes 133 and/or 134 and engage nuts in selected holes in the rails. Thus the position of the transverse members on the rails 14 can be chosen approximately by selection of appropriate perforations in the rails and a fine adjustment can be made by virtue of the elongate nature of the holes 133, 134.

Usually, the front transverse members will be the same distance forward of the side frame members 1a, 1b as the rear transverse members are to the rear of the side frame members, but it will be understood that this does not have to be the arrangement and indeed, if mounting rails are required only at the front or rear, one pair of transverse members may be omitted altogether. The pairs of mounting angles 22a, 22b and 23a, 23b are usually required to be at a fixed separation and therefore a user does not usually adjust the positions at which the mounting angles are fixed to the transverse members 13. It should be understood, however, that such adjustment is possible and may be desirable in a particular application, for example if it is desired to have a pair of mounting angles offset to one side of the enclosure.

Whilst FIG. 6 shows the arrangement at the top of the enclosure, it should be understood that the arrangement at the bottom of the enclosure is substantially the same.

Figure 7A:
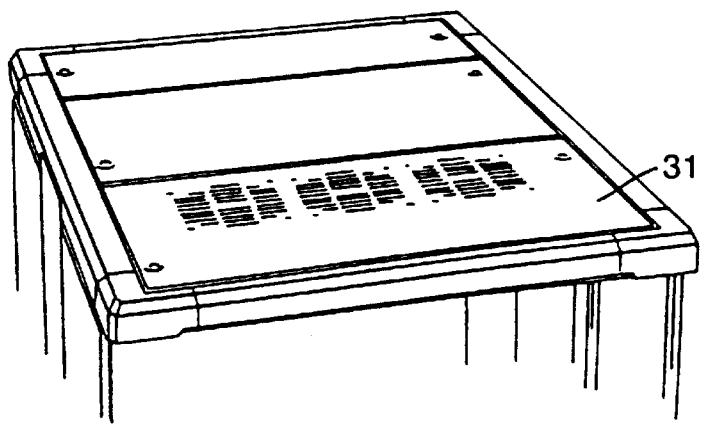
FIG. 7a is a perspective view of the top of the enclosure shown in FIG. 5 with ventilation openings shown in one position.
Figure 7B:
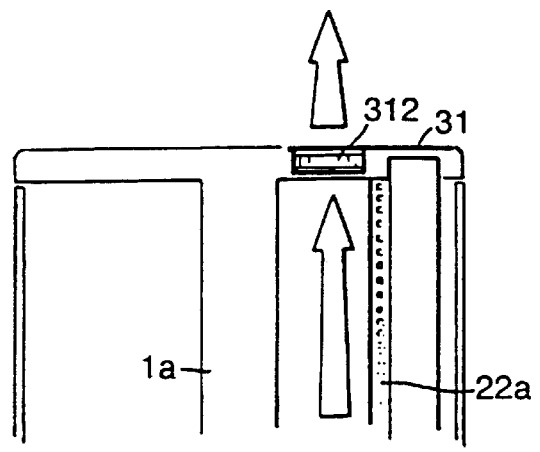
FIG. 7b is a schematic side sectional view of the top of the enclosure showing a suitable position for the mounting angles when the ventilation openings are in the position shown in FIG. 7a, FIG. 7c is a schematic side sectional view of the top of the enclosure showing an alternative position for the mounting angles.
Figure 7C:
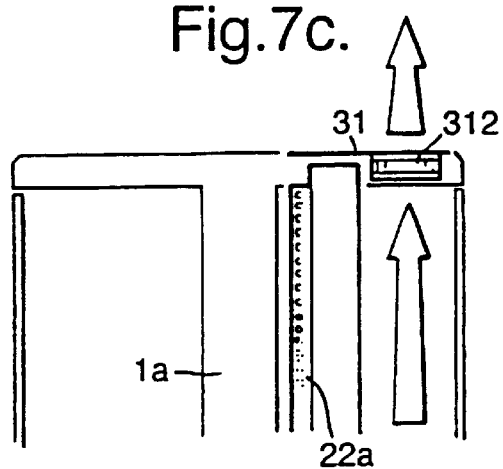

FIGS. 7a to 7c illustrate different ventilation arrangements which may be adopted for different positions of the mounting angles. In the case of FIGS. 7a and 7b, the mounting angles 22a, 22b are towards the front of the enclosure and a ventilation path for air is provided immediately behind the mounting angles, with ventilation openings 312 provided in the rear portion of the front top panel 31. In FIG. 7c, on the other hand, the mounting angles 22a, 22b are less far forward, a ventilation path for air is provided immediately in front of the mounting angles and the front top panel 31 is turned around so that ventilation openings are at the extreme front of the enclosure.

Figure 9:
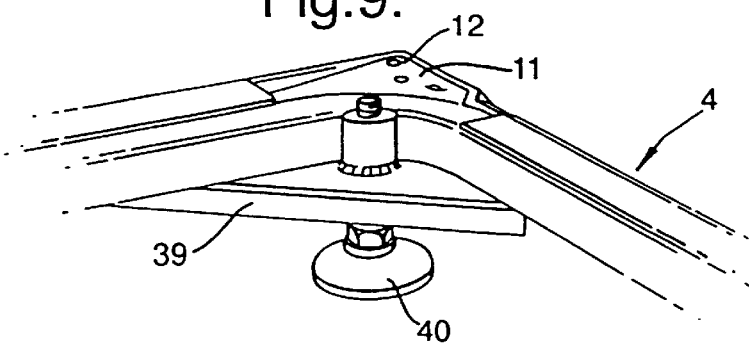
FIG. 9 is a perspective view of a detail of the construction at the bottom of the enclosure.

FIG. 9 shows a detail relating to the bottom frame member 4 of the enclosure. In the particular example illustrated in FIG. 9, a foot mounting plate 39 is fixed to the underside of the frame member 4 at each corner and a foot 40, the height of which is screw-adjustable, is mounted on each plate 39.

As will be understood from the description above, a user can gain very good access to all parts of the enclosure by pivoting or fully detaching certain panels. For example, opening side panels 26b and 27b provides good access to the enclosure from the side. It should be noted that the frame does not protrude into the interior volume of the enclosure to any significant extent and no upright frame members exist in the region of any of the corners of the enclosure. At the same time, the skeleton frame structure provides a design that is strong and lightweight.

The completed enclosure will typically have a width and depth in the range of 500 to 1,000 mm and a height in the range of 600 to 2,500 mm. The enclosure can be provided as a flat pack.

Figure 10:
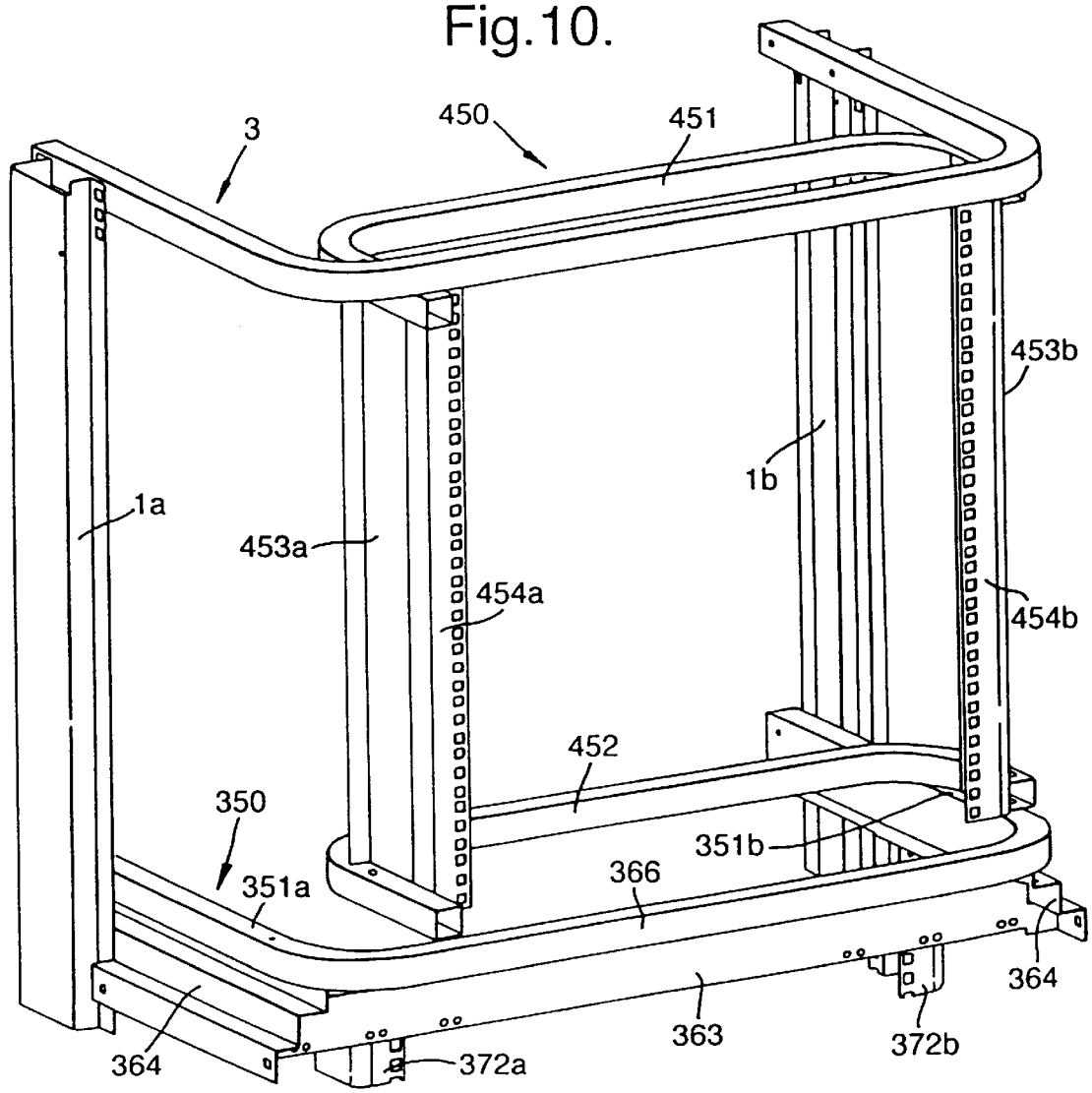
FIG. 10 is a schematic perspective view of a portion of the frame of the enclosure illustrating an alternative arrangement of mounting angles on the frame.

Whilst one particular form of enclosure has been described above, there are of course many modifications that can be made to the design. For example, FIG. 10 shows the upper portion of an enclosure which has a similar skeleton frame structure to the enclosure of FIGS. 1 to 9 but a different arrangement of mounting angles; also the frame incorporates a swing frame. Both of those features will be described below with reference to FIG. 10.

The skeleton frame of the enclosure according to FIG. 10 includes, in addition to the top and bottom frame members 3, 4, a mid-height frame member 350. In the example shown the frame member 350 projects only forwardly from the upright side frame members 1a, 1b but it will be understood that, if desired, the frame member 350 may also extend rearwardly from the upright side frame members. The frame member 350 is fixed in cantilever fashion to the side frame members 1a, 1b and consists essentially of elongate side frame portions 351a, 351b and an elongate transverse portion 366 at the front.

Fixed to the side frame portions 351a and 351b of the mid-height frame member 350 are fixing rails 364 (similar to the rails 14 described above). A transverse member 363 (similar to the transverse members 13 described above) is in turn secured at each end to the fixing rails 364. The transverse member 363 serves as a fixing point for the top of each of a pair of mounting angles 372a and 372b which extend downwardly from the transverse member 363 to the transverse member 13 at the bottom front of the enclosure. Thus it will be understood that the provision of the mid-height frame member 350 enables a pair of mounting angles in a lower portion of the enclosure to be at a different spacing from a pair of mounting angles in an upper portion of the enclosure. Thus one enclosure is able to accommodate mounting angles according to both the IEC 297-1 standard or the ETSI 300-119 Part 3 standard. Of course, it should be understood that various other arrangements of mounting angles according to one or both of the above standards may also be provided. It is also possible, however, to provide a swing frame in the upper portion of the enclosure as is shown in FIG. 10. The swing frame, designated generally by reference numeral 450, comprises a pair of upper and lower frame members 451 and 452 respectively connected at each end by upright frame members 453a and 453b including mounting angles 454a and 454b at their fronts. The right hand side of the swing frame (as seen in FIG. 10) is pivotably connected at it front end to the frame members 3 and 350 for pivoting about a vertical axis. It will be seen from FIG. 10 that the swing frame 450 is accommodated within the space between the frame members 3 and 350 and can therefore be swung outwardly about its axis of pivoting. Outward pivotal movement of the swing frame of 90° can be accommodated without the need even to partly detach a side panel of the enclosure and, if the side panel is partly detached, the swing frame can be pivoted through an angle of about 180°.

Whilst FIG. 10 shows a swing frame mounted in the upper portion of an enclosure it should be understood that a swing frame can alternatively be mounted in the lower portion of the enclosure and also that a swing frame extending over almost the full height of the enclosure may be provided.

In the illustrated embodiments the mounting angles are supported by the frame indirectly (via the transverse members 13 and rails 14). It is also possible for the mounting angles to be fixed directly to the frame members 3, 4 or to be fixed directly to the rails 14; such a more direct fixing is especially appropriate if the mounting angles are to be positioned at the lateral extremities of the enclosure; that will of course depend upon the overall width of the enclosure and the desired lateral spacing of mounting angles of a pair.

If desired, a base module may be added below the frame member 4. Such a base module may for example house cable connections for equipment mounted in the enclosure or ventilation equipment. For example a fan arranged to direct air upwards through the enclosure for cooling purposes may be provided.

What is claimed is:

1. An enclosure suitable for use in a telecommunications or data communications network, the enclosure having a front, a rear, a first side and a second side opposite the first side and including a frame, upright mounting angles suitable for mounting equipment for use in a telecommunications or data communications network and a plurality of panels, the frame including first and second upright frame members, an upper forward cantilevered frame portion including elongate side frame portions extending from the upright frame members substantially horizontally forwardly along opposite sides of the enclosure and an upper rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members, the upright mounting angles being provided in a front region of the enclosure in front of and spaced forwardly of the upright frame members.

2. An enclosure according to claim 1, in which the frame includes upper and lower forward and rearward cantilevered frame portions.

3. An enclosure according to claim 1, in which the side frame portions and transverse frame portion of each cantilevered frame portion are integral with one another.

4. An enclosure according to claim 1, in which one or more of the panels are at least partly detachable.

5. An enclosure according to claim 1, in which at least a major part of a first side of the enclosure is defined by a front side panel extending forwardly from the first upright frame member and a rear side panel extending rearwardly from the first upright frame member, one of the side panels being at least partly detachable.

6. An enclosure according to claim 5, in which the front side panel is pivotable about a substantially vertical axis at a front and/or rear end of the panel.

7. An enclosure according to claim 5, in which the rear side panel is pivotable about a substantially vertical axis at a front and/or rear end of the panel.

8. An enclosure according to claim 5, in which substantially all of the first side of the enclosure is defined by the first upright frame member, the front side panel extending forwardly from the first upright frame member and the rear side panel extending rearwardly from the first upright frame member.

9. An enclosure according to claim 1, in which at least a major part of a first side of the enclosure is defined by a first front side panel extending forwardly from the first upright frame member and a first rear side panel extending rearwardly from the first upright frame member and at least a major part of a second opposite side of the enclosure is defined by a second front side panel extending forwardly from the second upright frame member and a second rear side panel extending rearwardly from the second upright frame member.

10. An enclosure according to claim 1, further including a front door panel defining the front of the enclosure, the front door panel being at least partly detachable.

11. An enclosure according to claim 1, further including a rear door panel defining the back of the enclosure, the rear door panel being at least partly detachable.

12. An enclosure according to claim 1, in which the front of the enclosure at the first side of the enclosure is free of any frame members of substantial vertical extent compared to a height of the enclosure.

13. An enclosure according to claim 1, in which the upright frame members are each substantially equispaced from front and rear extremities of the enclosure.

14. An enclosure according to claim 1, in which the frame is a skeleton frame.

15. An enclosure according to claim 1, in which the frame portions comprise one or more tubular members or roll form section members.

16. An enclosure according to claim 1, in which the mounting angles are supported at least partly by the upper forward cantilevered frame portions.

17. An enclosure according to claim 1, including a plurality of pairs of upright mounting angles, one pair being spaced further apart from one another than another pair.

18. A flat pack including frame members and panels for assembling on site into an enclosure according to claim 1.

19. An enclosure according to claim 1, including further upright mounting angles provided in a rear region of the enclosure to the rear of and spaced rearwardly of the upright frame members.

20. An enclosure suitable for use in a telecommunications or data communications network, the enclosure having a front, a rear, a first side and a second side opposite the first side and including a frame, upright mounting angles suitable for mounting equipment for use in a telecommunications or data communications network and a plurality of panels, the frame including first and second upright frame members, an upper forward cantilevered frame portion including elongate side frame portions extending from the upright frame members substantially horizontally forwardly along opposite sides of the enclosure and an elongate transverse portion at the front, and an upper rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members, the upright mounting angles including a first pair of upright mounting angles in a front region of the enclosure in front of and spaced forwardly of the upright frame members and a second pair of upright mounting angles in a rear region of the enclosure to the rear of and spaced rearwardly of the upright frame members.

21. An enclosure suitable for use in a telecommunications or data communications network, the enclosure having a front, a rear, a first side and a second side opposite the first side and including a frame, upright mounting angles suitable for mounting equipment for use in a telecommunications or data communications network and a plurality of panels, the frame including first and second upright frame members, an upper forward cantilevered frame portion including elongate side frame portions extending from the upright frame members substantially horizontally forwardly along opposite sides of the enclosure and an elongate transverse portion at the front, and an upper rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members, the upright mounting angles being provided in a front region of the enclosure in front of and spaced forwardly of the upright frame members, at least a major part of the first side of the enclosure is defined by a first front side panel extending forwardly from the first upright frame member and a first rear side panel extending rearwardly from the first upright frame member and at least a major part of the second opposite side of the enclosure is defined by a second front side panel extending forwardly from the second upright frame member and a second rear side panel extending rearwardly from the second upright frame member.

22. An enclosure suitable for use in a telecommunications or data communications network, the enclosure having a front, a rear, a first side and a second side opposite the first side and including a frame, upright mounting angles suitable for mounting equipment for use in a telecommunications or data communications network and a plurality of panels, the frame including first and second upright frame members, and upper and lower cantilevered frame portions, the upper cantilevered frame portion comprising an upper forward cantilevered frame portion including elongate side frame portions extending from the upright frame members substantially horizontally forwardly along opposite sides of the enclosure and an elongate transverse portion at the front, and an upper rearward cantilevered frame portion including elongate side frame portions extending from the upright frame members substantially horizontally rearwardly along opposite sides of the enclosure and an elongate transverse portion at the rear, the lower cantilevered frame portion comprising a lower forward cantilevered frame portion including elongate side frame portions extending from the upright frame members substantially horizontally forwardly along opposite sides of the enclosure and an elongate transverse portion at the front, and a lower rearward cantilevered frame portion including elongate side frame portions extending from the upright frame members substantially horizontally rearwardly along opposite sides of the enclosure and an elongate transverse portion at the rear, the side frame portions being fixed directly or indirectly to the upright frame members, the upright mounting angles being provided in a front region of the enclosure in front of and spaced forwardly of the upright frame members, each of the upper and lower cantilevered frame portions being formed exclusively from members disposed exclusively around the sides of the frame.

* * * * *